(12) United States Patent
Tu et al.

(10) Patent No.: US 11,067,906 B2
(45) Date of Patent: Jul. 20, 2021

(54) DROPLET CATCHER SYSTEM OF EUV LITHOGRAPHY APPARATUS AND EUV LITHOGRAPHY APPARATUS MAINTENANCE METHOD

(71) Applicant: Taiwan Semiconductor Manufacturing Co., Ltd., Hsinchu (TW)

(72) Inventors: Shih-Yu Tu, Hsinchu County (TW); Po-Chung Cheng, Chiayi County (TW); Hsiao-Lun Chang, Tainan (TW); Li-Jui Chen, Hsinchu (TW); Han-Lung Chang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/805,836

(22) Filed: Mar. 2, 2020

(65) Prior Publication Data

US 2021/0033986 A1 Feb. 4, 2021

Related U.S. Application Data

(60) Provisional application No. 62/880,055, filed on Jul. 29, 2019.

(51) Int. Cl.
*H05G 2/00* (2006.01)
*G03F 7/20* (2006.01)

(52) U.S. Cl.
CPC ...... *G03F 7/70875* (2013.01); *G03F 7/70033* (2013.01); *H05G 2/006* (2013.01); *G03F 7/70975* (2013.01)

(58) Field of Classification Search
CPC ............ G03F 7/70916; G03F 7/70033; G03F 7/70875; G03F 7/70975; G03F 7/2004; G03F 7/70933; G03F 7/70925; G03F 7/70983; G03F 7/70891; H05G 2/008; H05G 2/006; H05G 2/005; H05G 2/003; F28D 7/024
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2011/0101863 A1* | 5/2011 | Komori | G21K 5/00 315/111.41 |

(Continued)

*Primary Examiner* — Mesfin T Asfaw
(74) *Attorney, Agent, or Firm* — JCIPRNET

(57) ABSTRACT

A droplet catcher system of an EUV lithography apparatus is provided. The droplet catcher system includes a catcher body, a heat transfer part, a heat exchanger, and a controller. The catcher body has an outer surface. The heat transfer part is directly attached to the outer surface of the catcher body. The heat exchanger is thermally coupled to the heat transfer part. The controller is electrically coupled to the heat exchanger.

20 Claims, 14 Drawing Sheets

(56) References Cited

U.S. PATENT DOCUMENTS

2012/0097869 A1* 4/2012 Ueno .................. H05G 2/008
250/504 R
2014/0326904 A1* 11/2014 Ceglio ................ H05G 2/005
250/504 R

* cited by examiner

DROPLET CATCHER SYSTEM OF EUV LITHOGRAPHY APPARATUS AND EUV LITHOGRAPHY APPARATUS MAINTENANCE METHOD

CROSS-REFERENCE TO RELATED APPLICATION

This application claims the priority benefits of U.S. provisional application Ser. No. 62/880,055, filed on Jul. 29, 2019. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. Such scaling down has also increased the complexity of processing and manufacturing ICs.

As merely one example, semiconductor lithography processes may use lithographic templates (e.g., photomasks or reticles) to optically transfer patterns onto a substrate. The minimum feature size that may be patterned by way of such a lithography process is limited by the wavelength of the projected radiation source. In view of this, extreme ultraviolet (EUV) radiation sources and lithographic processes have been introduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
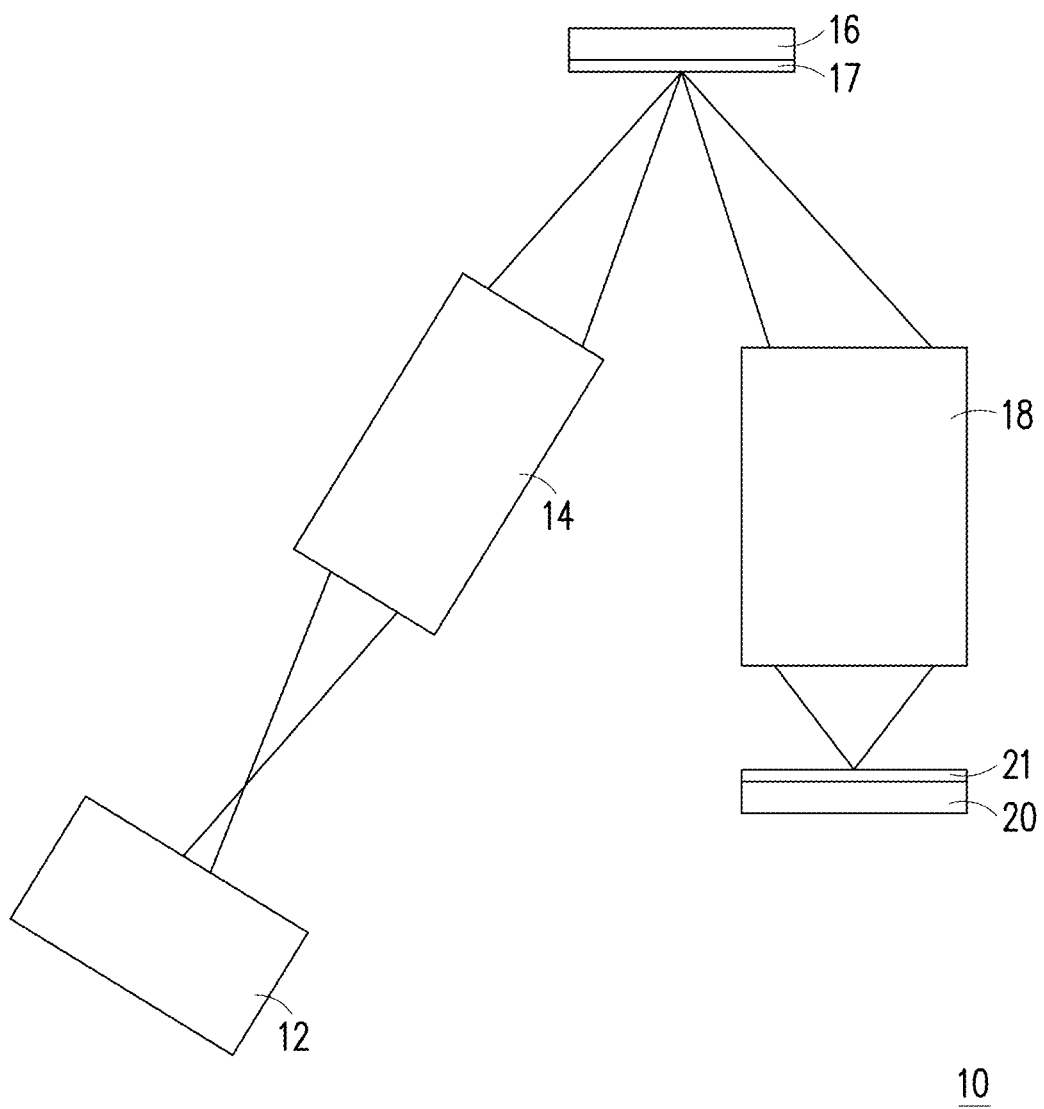
FIG. 1 schematically illustrates an EUV lithography apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 schematically illustrates an EUV lithography apparatus in accordance with some embodiments of the present disclosure. Referring to FIG. 1, the EUV lithography apparatus 10 is a projection system or a scanner that is operable to perform lithography processes including exposure process with a respective radiation source and in a particular exposure mode. In some embodiments, the EUV lithography apparatus 10 is adapted to expose a resist layer by EUV light. In various embodiments, the resist layer includes a material sensitive to the EUV light (e.g., an EUV resist). The EUV lithography apparatus 10 of FIG. 1 includes a plurality of subsystems such as a radiation source 12, an illuminator 14, a mask stage 16 configured to receive a mask 17, projection optics 18, and a substrate stage 20 configured to receive a semiconductor substrate 21.

A general description of the operation of the EUV lithography apparatus 10 may be given as follows: EUV light from the radiation source 12 is directed toward the illuminator 14 (which includes a set of reflective optics and/or reflective optics) and projected onto the mask 17. A reflected mask image is directed toward the projection optics 18, which focuses the EUV light and projects the EUV light onto the semiconductor substrate 21 to irradiate an EUV resist layer deposited thereupon. Additionally, in various examples, each subsystem of the EUV lithography apparatus 10 may be housed in, and thus operate within, a high-vacuum environment, for example, to reduce atmospheric absorption of EUV light.

In the embodiments described herein, the radiation source 12 may be used to generate the EUV light. Particularly, the radiation source 12 may generate the EUV light using a laser produced plasma (LPP). In some examples, the EUV light may include light having a wavelength ranging from about 1 nm to about 100 nm. In one example, the radiation source 12 generates EUV light with a wavelength centered at about 13.5 nm. The radiation source 12 in accordance with some embodiments of the present disclosure will be further described later.

In some embodiments, the EUV light generated from the radiation source 12 is directed toward imaging optics such as the illuminator 14. In some embodiments, the illuminator 14 may include reflective optics, such as a single mirror or a mirror system having multiple mirrors in order to direct light from the radiation source 12 onto the mask stage 16, and particularly to the mask 17 secured on the mask stage 16. In some embodiments, the illuminator 14 is operable to configure the mirrors (i.e., of the illuminator 14) to provide a desired illumination to the mask 17. In one example, the mirrors of the illuminator 14 are configurable to reflect EUV light to different illumination positions. It should be noted that the optics employed in the EUV lithography apparatus 10, and in particular optics used for the illuminator 14 and the projection optics 18, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the EUV lithography apparatus 10 also includes the mask stage 16 configured to secure the mask 17. As illustrated in the example of FIG. 1, the mask 17 is reflective, and the light reflected from the mask 17 is directed towards the projection optics 18, which collects the EUV light reflected from the mask 17. By way of example, the EUV light collected by the projection optics 18 (reflected from the mask 17) carries an image of the pattern defined by the mask 17. In various embodiments, the projection optics 18 provides for imaging the pattern of the mask 17 onto the semiconductor substrate 21 secured on the substrate stage 20 of the EUV lithography apparatus 10. In particular, in various embodiments, the projection optics 18 focuses the collected EUV light and projects the EUV light onto the semiconductor substrate 21 to irradiate an EUV resist layer deposited on the semiconductor substrate 21. As described above, the projection optics 18 may include reflective optics. In some embodiments, the EUV lithography apparatus 10 may also include a pupil phase modulator to modulate an optical phase of the EUV light directed from the mask 17. In some embodiments, the pupil filter may serve as a phase pupil filter that modulates the phase distribution of the light directed through the projection optics 18.

As discussed above, the EUV lithography apparatus 10 also includes the substrate stage 20 to secure the semiconductor substrate 21 to be patterned. In various embodiments, the semiconductor substrate 21 includes a semiconductor wafer, such as a silicon wafer, germanium wafer, silicon-germanium wafer, III-V wafer, or other type of wafer as described above or as known in the art. The semiconductor substrate 21 may be coated with a resist layer (e.g., an EUV resist layer) sensitive to EUV light. In the embodiments described herein, the various subsystems of the EUV lithography apparatus 10, including those described above, are integrated and are operable to perform lithography exposing processes including EUV lithography processes. The EUV lithography apparatus 10 may further include other modules or subsystems which may be integrated with (or be coupled to) one or more of the subsystems or components described herein. For example, a safety instrumented system (not shown) may be included in the EUV lithography apparatus 10 for detecting and eliminating the likelihood of a safety, health and environmental event.

Figure 2:
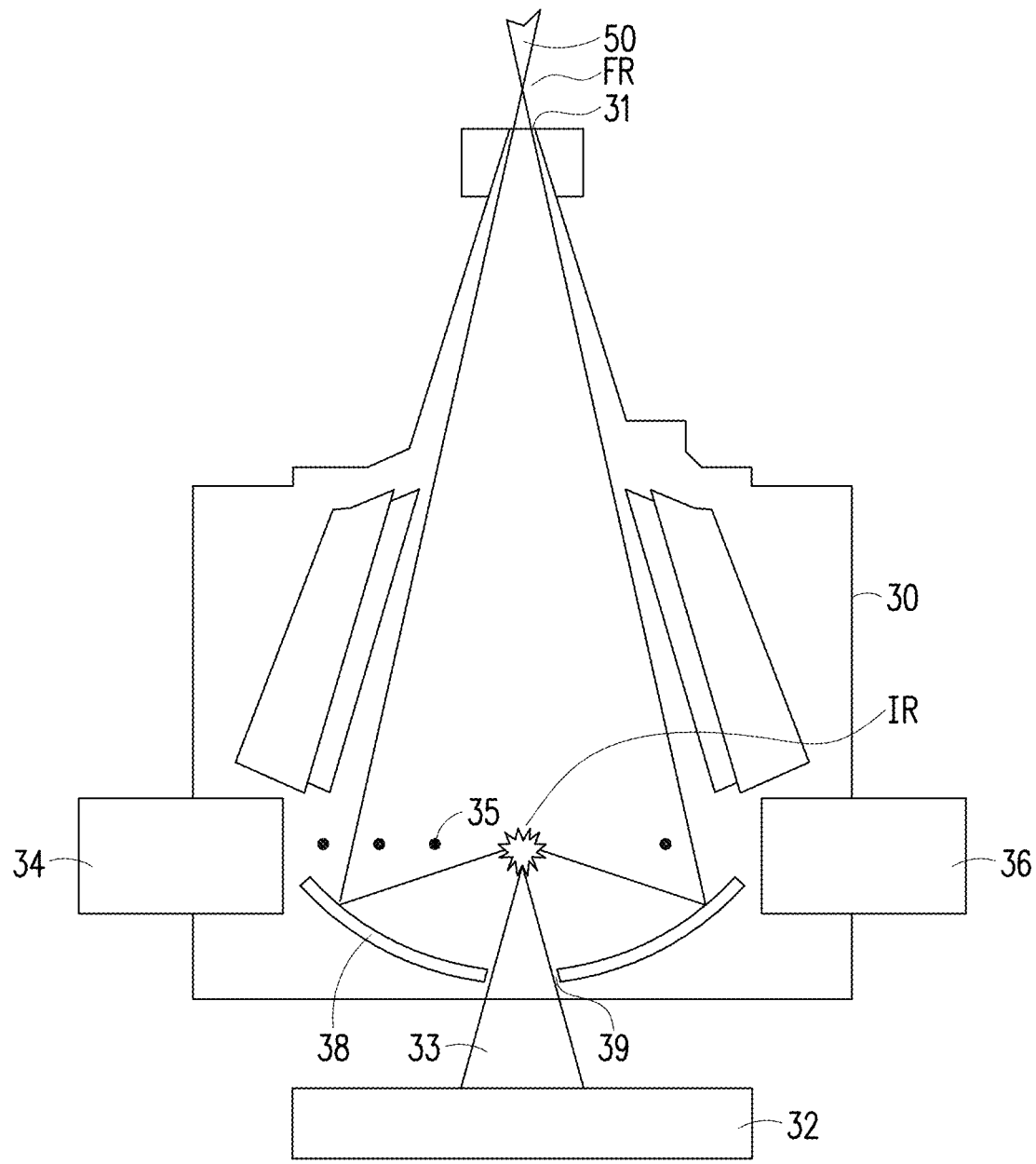
FIG. 2 schematically illustrates the radiation source of the EUV lithography apparatus shown in FIG. 1 in accordance with some embodiments of the present disclosure.

FIG. 2 schematically illustrates a radiation source 12 of an EUV lithography apparatus, in accordance with some embodiments of the present disclosure. The radiation source 12 of FIG. 2 is illustrative of an exemplary system that creates EUV wavelength radiation, which can be delivered to other parts of an EUV lithography apparatus, for example, the EUV lithography apparatus 10. As stated above, the radiation source 12 may employ a laser produced plasma (LPP) mechanism to generate plasma and further generate EUV light from the plasma.

Referring to FIG. 2, the radiation source 12 in FIG. 2 may include a source vessel 30, a laser source 32, a droplet generator 34, a droplet catcher 36, and a collector 38. As shown in FIG. 2, the droplet generator 34 and the droplet catcher 36 are connected to the source vessel 30 and aligned with each other. The collector 38 may be positioned in the source vessel 30 and may have an aperture (or opening) 39 about the center to allow a laser beam 33 provided by the laser source 32 to pass through and reach an irradiation region IR in the source vessel 30. The source vessel 30, during the radiation source 12 generating EUV radiation, may maintain a vacuum environment to reduce absorption of EUV radiation by air, in accordance to some embodiments of the present disclosure.

The laser source 32 (e.g., such as a $CO_2$ laser) generates a laser beam 33. The laser source 32 may be a gas discharge $CO_2$ laser source (e.g., producing radiation at about 10.6 microns ($\mu m$)), and other appropriate lasers. The laser beam 33 may then be directed into the source vessel 30. The laser beam 33 may be a continuous beam or a series of pulses. In some embodiments, the laser beam 33 includes one or more main pulses, and/or one or more pre-pulses.

In various embodiments, the droplet generator 34 may be configured to provide droplets 35 into the source vessel 30, and the droplet catcher 36 is positioned to be aligned with the droplet generator 34. The disposition positions of the droplet generator 34 and the droplet catchers may allow the droplets 35 generated by the droplet generator 34 passing through the laser beam 33 provided by the laser source 32. In some embodiments, the droplet generator 34 is subject to pressure from the inert gas for expelling the droplets 35. The droplet generator 34 may be a single droplet generator or may be further integrated with an inline refill system.

In some examples, the droplets 35 each may have a diameter in a range from about 10 μm to about 100 μm, for example, about 10 μm, about 30 μm, about 50 μm, or any diameter between these values. The droplets 35 generated by the droplet generator 34 may travel through the irradiation region IR of the source vessel 30 at a speed in a range of about 10 meters per second (m/s) to about 100 m/s in various embodiments. For example, in an embodiment, the droplets 35 may travel at a speed of about 10 m/s, about 25 m/s, about 50 m/s, about 75 m/s, about 100 m/s, or at any speed between these speeds. The droplets 35 may be generated at a frequency range from 20 kHz to 100 kHz, for example, about 50 kHz. The pulses of the laser source 32 and the droplet generating rate of the droplet generator 34 are controlled to be synchronized such that the droplets 35 may receive peak powers consistently from the laser pulses of the laser source 32. For example, the laser source 32 includes a laser circuit designed to control the generation of the laser pulses. The circuit of the laser source 32 and the circuit of the droplet generator 34 are electrically coupled to synchronize the generation of the laser pulses and the generations of the droplets 35. The material may be used for the droplets 35, for example, tin, a tin compound, a tin-containing liquid material such as eutectic alloy containing tin, lithium (Li), and xenon (Xe).

In some embodiments, the collector 38 may include a normal incidence reflector, for example, implemented as a multilayer mirror (MLM). For example, the collector 38 may include a silicon carbide (SiC) substrate coated with a Mo/Si multilayer. In some examples, other substrate materials may be used for the collector 38 such as Al, Si, or other type of substrate materials. The collector 38 may be an ellipsoid-shape with a first focus at the irradiation region IR and a second focus at an intermediate focus region FR such that the EUV light 50 produced in the source vessel 30 may be collected by the collector 38 and output from the source vessel 30 through the intermediate focus region FR.

In some embodiments, the laser beam 33 passes through the aperture 39 of the collector 38 and irradiates droplets 35 at the irradiation region IR, such as tin droplets, generated by the droplet generator 34, thereby generating high-temperature plasma, which further produces the EUV light 50. By way of example, the EUV light 50 collected by the collector 38 may be directed to pass through an output port 31 of the source vessel 30 and then irradiate an illuminator, e.g., the illuminator 14 as shown in FIG. 1, so as to direct the EUV light 50 from the radiation source 12 onto the mask stage 16 as shown in FIG. 1. As shown in FIG. 1, the EUV light 50 may be transmitted to other parts of the EUV lithography apparatus 10 for processing of a semiconductor substrate as stated above. In various embodiments, the laser beam 33 may or may not hit every droplet 35. For example, some droplets 35 may be purposely missed by the laser beam 33. In some embodiments, the droplet catcher 36, which is installed opposite the droplet generator 34 and in the direction of the movement of the droplets 35, is configured to catch the droplets 35 that are missed by the laser beam 33.

In various embodiments, the amount of droplet material can be stored in the droplet generator 34 is limited. Therefore, whenever the droplet material runs out, the radiation source 12 has to be shut down in order for the droplet generator 34 to be refilled or swapped. In some instances, after the droplet material is refilled or swapped, the source vessel 30 has to be cleaned and purged. As such, periodical performance of preventive maintenance on the radiation source, for example, radiation source 12 as shown in FIG. 2, is required. Despite supplementary of the droplet generator 34, PM process may be required for draining out droplet material captured in the droplet catcher 36. However, PM process may disrupt the semiconductor manufacturing process and reduce throughput of the EUV lithography apparatus 10.

Figure 3:
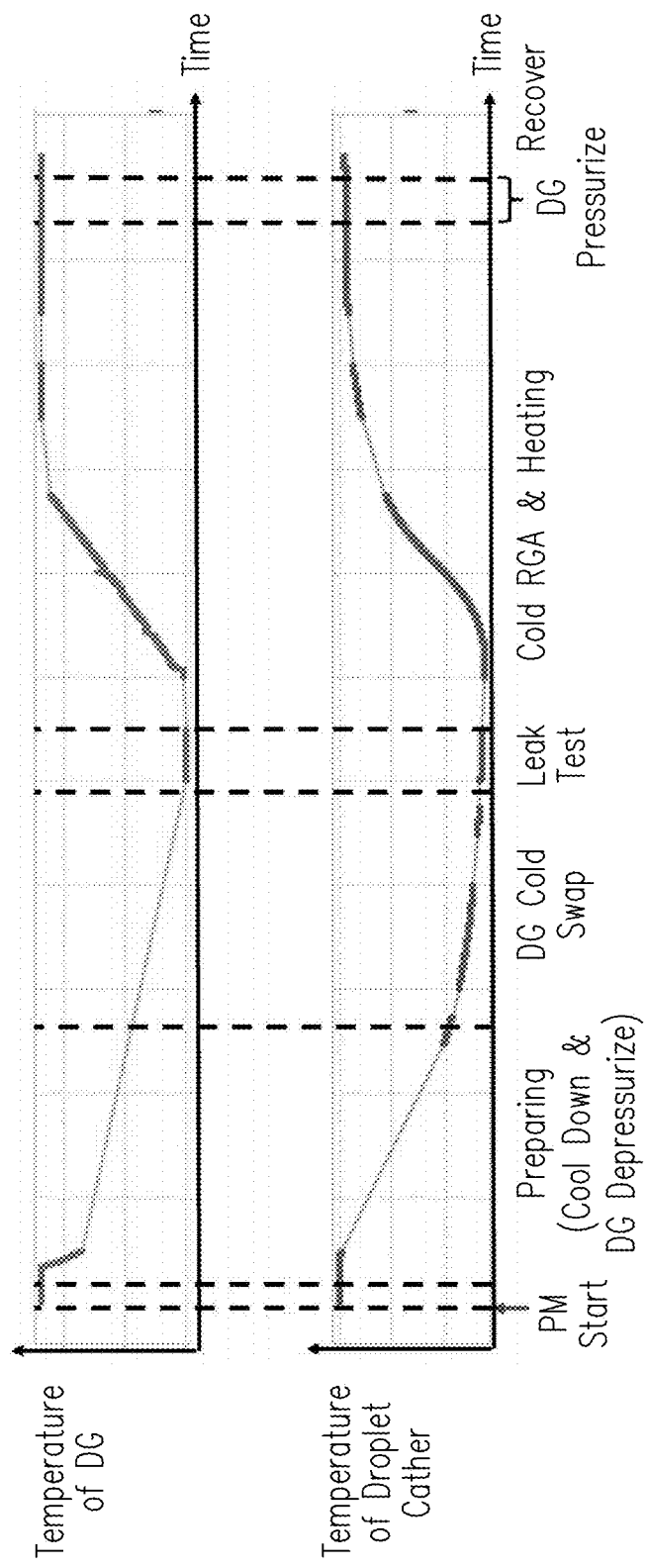
FIG. 3 shows temperature variations of a droplet generator (DG) and a droplet catcher undergoing an exemplary preventive maintenance (PM) process of an EUV lithography apparatus.

FIG. 3 shows temperature variations of a droplet generator (DG) and a droplet catcher undergoing an exemplary preventive maintenance process of an EUV lithography apparatus. Particularly, FIG. 3 shows temperature variations of the droplet generator 34 and the droplet catcher 36 undergoing an exemplary DG cold swap process. In the present embodiment, the DG cold swap process may include stages, in sequence, form preparing, DG cold swap, leak test, cold residual gas analysis (RGA) and heating, DG pressurizing, to recover. At the preparing stage, the droplet generator and the droplet catcher, for example, the droplet generator 34 and the droplet catcher 36 may be cooled. During the preparing stage, the droplet generator may be also depressurized to atmospheric pressure. After the temperature of the droplet generator and the droplet catcher drop to a predetermined maintenance temperature, for example, 120° C., or 100° C. or lower, or room temperature, the vacuum status of the source vessel (e.g., source vessel 30) may be broken and the DG cold swap, i.e., replacing presently used DG with a new one, may be performed. Upon the droplet generator is swapped, the source vessel is re-built into an air-tight enclosed chamber, and the leak test for the source vessel is performed. After passing the leak test, the source vessel may undergo the cold RGA and then the droplet generator and the droplet catcher are heated to a predetermined operating temperature, for example, more than 255° C. to 300° C. In some instances, after reaching the operating temperature, the heating the droplet generator and the droplet catcher may be continued for a period of time to achieve temperature uniformity. Subsequently, the droplet generator may be pressurized for expelling droplets, and the radiation source may then proceed to the recover stage.

As will be further described, the droplet catcher systems for temperature control of the droplet catcher in accordance with some embodiments of the disclosure facilitate PM process for EUV lithography apparatus. As one example, a droplet catcher system in accordance with an embodiment of the present disclosure may reduce the time spent on the PM process for about 14.3% and thus increase the uptime of the EUV lithography apparatus. FIG. 3 exemplarily shows temperature variations of a droplet generator and a droplet catcher undergoing an exemplary DG cold swap process, however, the droplet generator and the droplet catcher may undergo similar variations under other types of PM processes, such as DG cold refill, DG warm swap, etc. The droplet catcher system and the maintenance method disclosed herein may facilitate DG cold swap process and other types of PM processes as well.

Figure 4A:
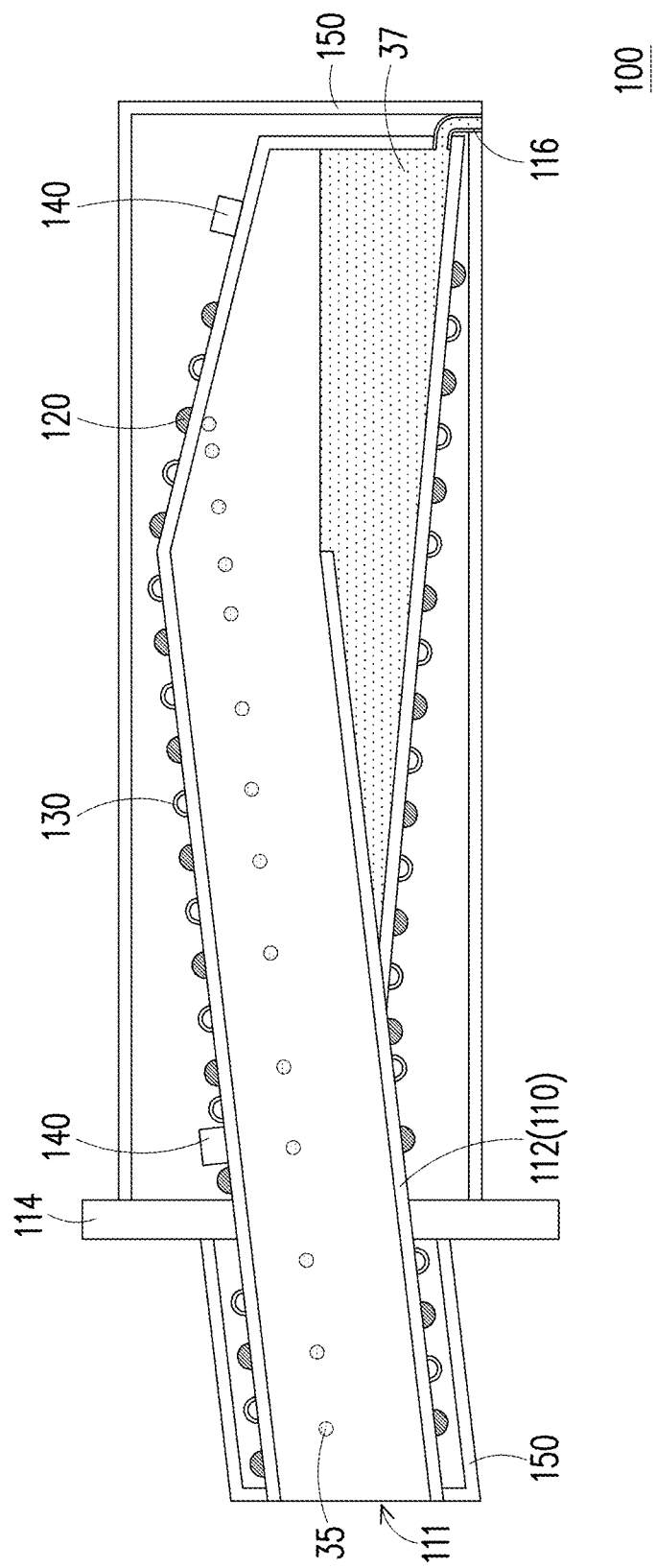
FIG. 4A is a cross-sectional view schematically illustrating a droplet catcher assembly of a droplet catcher system in accordance with some embodiments of the present disclosure.
Figure 4B:
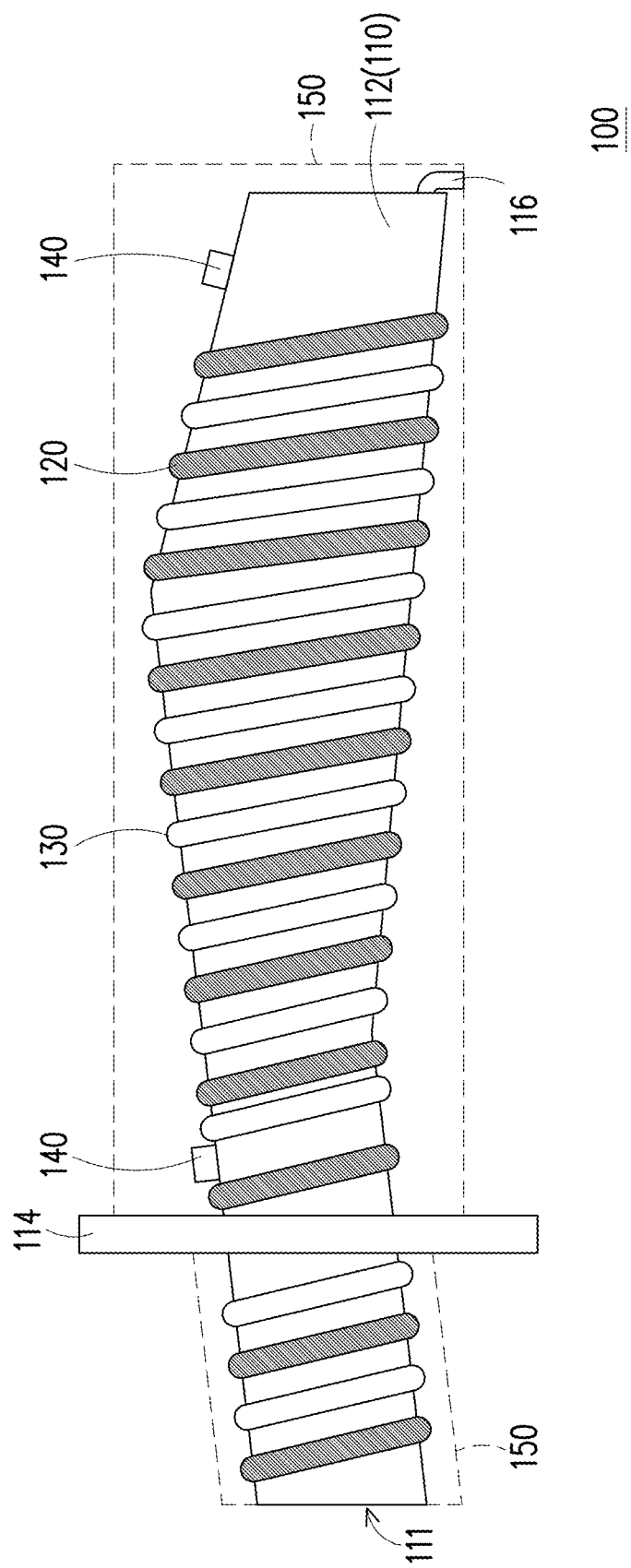
FIG. 4B is a perspective side view schematically illustrating the droplet catcher assembly shown in FIG. 4A in accordance with some embodiments of the present disclosure.

FIG. 4A is a cross-sectional view schematically illustrating a droplet catcher assembly in accordance with some embodiments, and FIG. 4B is perspective side view of the droplet catcher assembly shown in FIG. 4A. Referring to FIGS. 4A and 4B, in the present embodiment, the droplet catcher assembly 100 includes a catcher body 110, a first heat transfer part 120, and a second heat transfer part 130. As shown in FIG. 4A, the first heat transfer part 120 and the second heat transfer part 130 may be directly attached to the catcher body 110.

The catcher body 110 may include a tube portion 112 with a circular cross section or any other suitable shape configured to catch droplets, for example, the droplets 35 not irradiated by the laser beam, from the droplet generator 34 as shown in FIG. 2. In various embodiments, the tube portion 112 may be positioned so that the open end 111 of the catcher body 110 directs toward the droplet generator 34. In some instances, the catcher body 110 may include an accommodating space near the closed end of the catcher body 110. In some instances, the droplets 35 strike the inner wall of the catcher body 110. Upon striking, the droplets 35 reduce their velocity and may be captured by dropping into the accommodating space of the catcher body 110. In some instances, the accommodating space may contain a quantity of droplet material 37 in a liquid form that includes previously captured droplets. The catcher body 110, for example, may be made of copper, stainless steel, or other appropriate material that is able to withstand the strike of the droplets and is able to be heated to a preset operating temperature, for example, a temperature higher than 255° C. to 300° C., or higher than the melting point of the droplet material. In some embodiments, the droplet material may be tin which has the melting point at 231.9° C.

In some embodiments, the first heat transfer part 120 may be an electrical heater such as heating wire or heating coil, resistance wire, kanthal wire, or other suitable material capable of converting electrical energy into heat. In some embodiments, the second heat transfer part 130 may be a pipe allowing heat transfer fluid to flow through, and therefore, in some instances, the second heat transfer part 130 may be a pipe filled with heat transfer fluid. The heat transfer fluid may be, for example, liquid such as water, oil, liquid metal, or other thermal conducting liquid with or without conducting particle (e.g., high thermal conducting liquid with nano-particle metal). In some other instances, the heat transfer fluid may also be gas such as air, clean air, clean dry air (CDA), $N_2$, He, Ar, steam, or other thermal conducting gas.

Although as shown in FIGS. 4A and 4B, the first heat transfer part 120 and the second heat transfer part 130 are of different configurations, but it is contemplated that the first heat transfer part 120 may be another pipe allowing heat transfer fluid to flow through while the heat transfer fluid travelling in the first heat transfer part 120 and the heat transfer fluid travelling in the second heat transfer part 130 may be the same or different, in some of the embodiments. Such alternatives are within the scope of the present disclosure. In some embodiments, the pipe of the second heat transfer part 130 and/or the first heat transfer part 120 may be made of copper, stainless steel, or other appropriate material that is able to withstand the operation temperature, for example, a temperature higher than 255° C. to 300° C., or higher than the melting point of the droplet material.

In various embodiments, the first heat transfer part 120 and the second heat transfer part 130 are both directly attached to the catcher body 110 such that heat can be efficiently conducted between the catcher body 110 and the first heat transfer part 120 and between the catcher body 110 and the second heat transfer part 130. Therefore, an effective temperature control of the catcher body 110 may be achieved. For example, the temperature of the catcher body 110 may be made uniform in shorter time. In some instances, the first heat transfer part 120 and the second heat transfer part 130 may be directly attached to the outer surface of the catcher body 110, as shown in FIG. 4A. However, in other instances, the first heat transfer part 120, the second heat transfer part 130, or both, may be embedded in the catcher body 110, in other words, at least a portion of the first heat transfer part 120, the second heat transfer part 130, or both, may be encased in the wall of the catcher body 110. Further, in some embodiments, the first heat transfer part 120, the second heat transfer part 130, or both, may wind along an outer surface of the catcher body 110, under such instances, the first heat transfer part 120 or the second heat transfer part 130 may be arranged along a spiral-shaped path. Other suitable shapes of the first heat transfer part or the second heat transfer part, for example, line-shaped, are applicable in some embodiments of the present disclosure. In the present embodiment, the first heat transfer part 120, the second heat transfer part 130 and the catcher body 110 are integrated as a one piece. However, in some other embodiments, the first heat transfer part 120, the second heat transfer part 130, or both, may be discrete elements detachably attached to the outer surface of the catcher body.

In some embodiments, the catcher body 110 may further include a flange 114 connected to the tube portion 112. The flange 114 may protrude from and extend outwardly from the tube portion 112. In some instances, the flange 114 may keep a distance from an open end 111 of the tube portion 112. In some instances, the catcher body 110 may be connected to the source vessel 30 (shown in FIG. 2) by fixing the flange 114 onto the source vessel 30 so that a portion of the tube portion 112 adjacent to the open end 111 may be inserted into the source vessel 30. The first heat transfer part 120, the second heat transfer part 130, or both, may extend to be positioned between the open end 111 and the flange 114, such that the first heat transfer part 120, the second heat transfer part 130, or both, may be positioned on a portion of the catcher body 110 that extends into the interior of the source vessel 30. By such configuration, for example, the temperature distribution over the catcher body 110 may be more uniform during the PM process, PM processing time may be shortened, and material backscattering and contamination of collector and source vessel may be relieved.

In some embodiments, the catcher body 110 may further include a drain pipe 116 connected to the catcher body 110, such that the droplet material 37 accumulated inside the accommodating space of the catcher body 110 may be drained out through the drain pipe 116. In some embodiments, the catcher body 110 may further include a temperature sensor 140 dispositioned on the catcher body 110. The temperature sensor 140 may be positioned on the outer surface of the catcher body 110 or may be embedded in the wall of the catcher body 110 for sensing and monitoring the temperature of the catcher body 110, particularly, the temperature under the PM process. The temperature sensor 140 may be a thermocouple, integrated circuit sensor, thermometer or any other known temperature sensor. More than one temperature sensor 140 may be dispositioned on different position of the catcher body 110, as shown in FIGS. 4A and 4B. Other positioning of the temperature sensor or other specific amount of temperature sensor are contemplated for use in the droplet catcher assembly 100 disclosed herein.

In some embodiments, the droplet catcher assembly 100 may include an outer housing 150. The outer housing 150 may cover the catcher body 110, the first heat transfer part 120, and the second heat transfer part 130 as shown in FIGS. 4A and 4B. In some instances, the catcher body 110 may be physically adjoined to the outer housing 150 while the first heat transfer part 120 and the second heat transfer part 130 are positioned between the catcher body 110 and the outer housing 150. In some instances, the outer housing 150 may be omitted, however, the present disclosure is not limited thereto. The outer housing 150 may prevent the first heat transfer part 120, and the second heat transfer part 130 from being exposed.

Figure 5A:
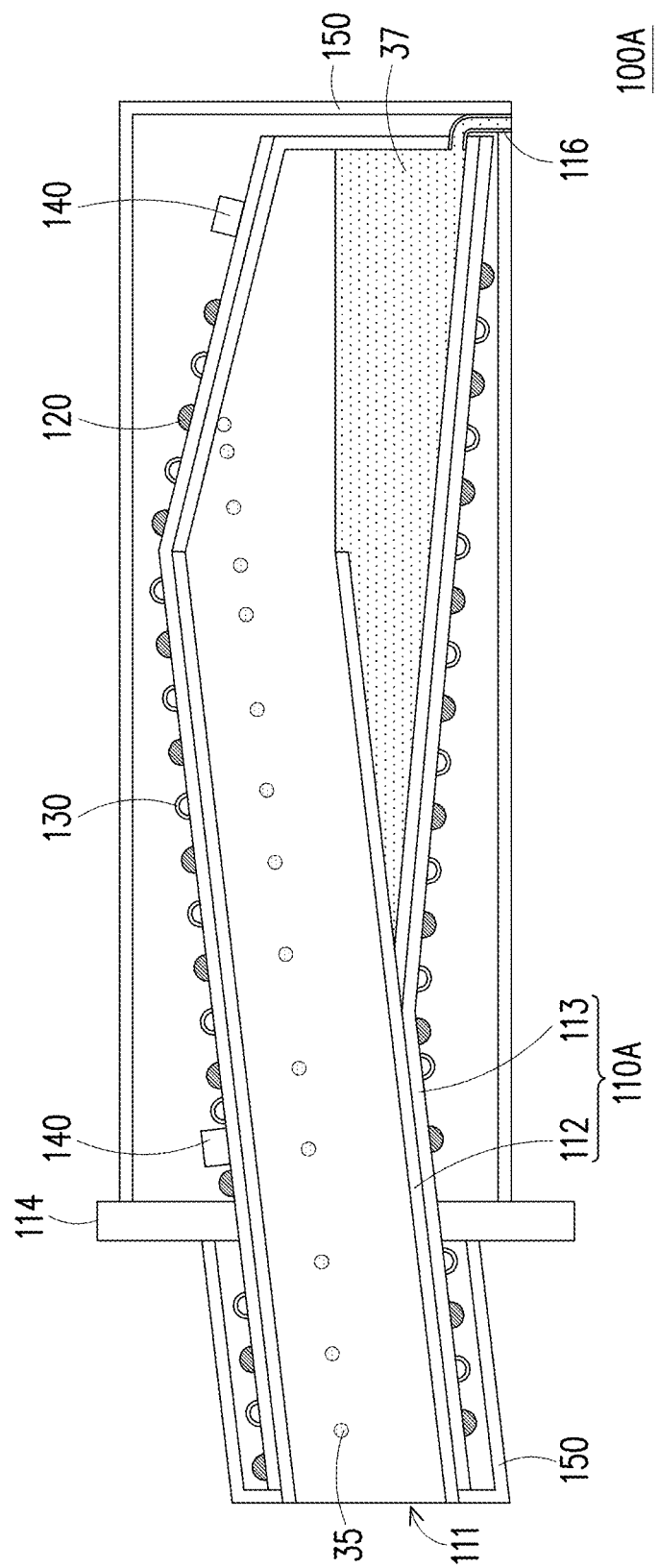
FIG. 5A is a cross-sectional view schematically illustrating a droplet catcher assembly of a droplet catcher system in accordance with some embodiments of the present disclosure.
Figure 5B:
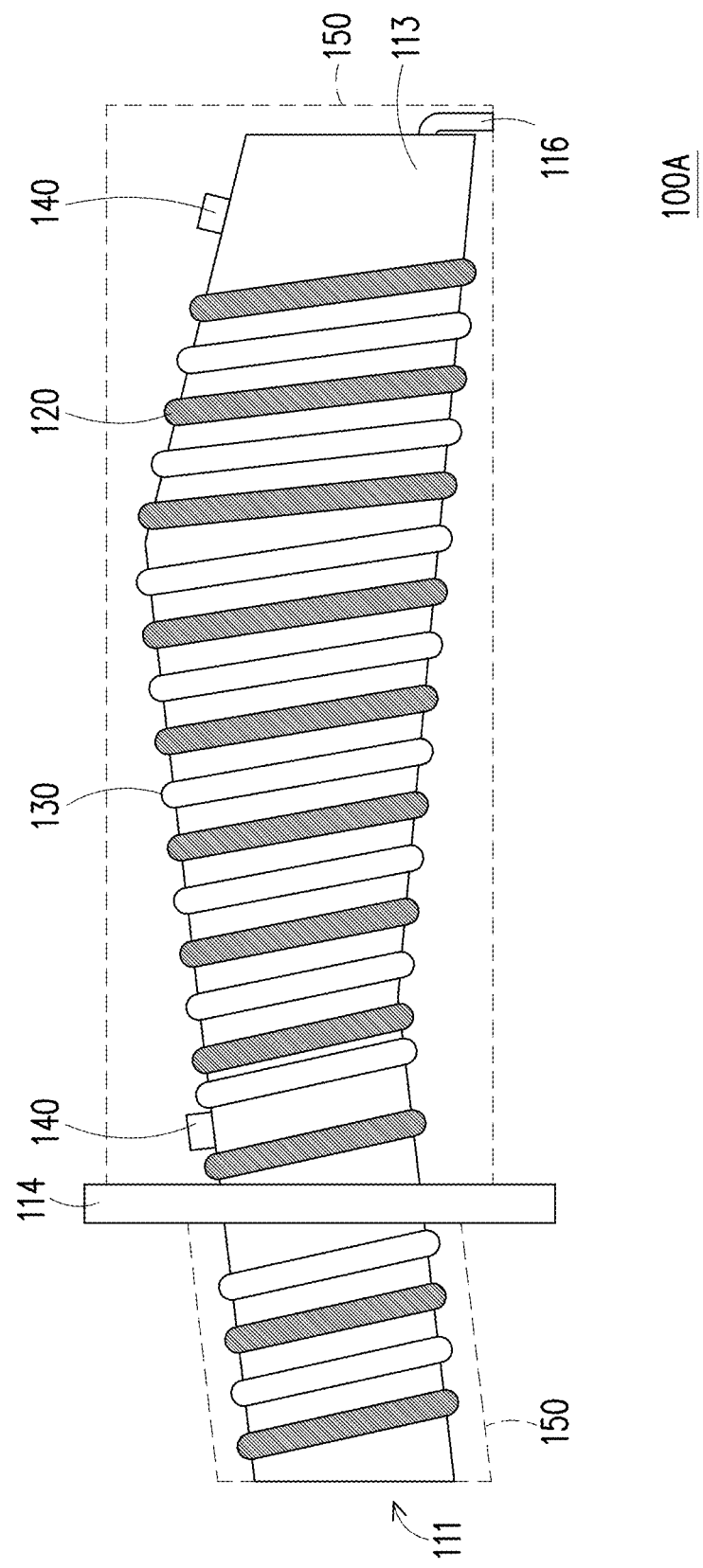
FIG. 5B is a perspective side view schematically illustrating the droplet catcher assembly shown in FIG. 5A in accordance with some embodiments of the present disclosure.

FIG. 5A is a cross-sectional view schematically illustrating a droplet catcher assembly of a droplet catcher system in accordance with some embodiments of the present disclosure, and FIG. 5B is a perspective side view schematically illustrating the droplet catcher assembly shown in FIG. 5A. Referring to FIGS. 5A and 5B, the droplet catcher assembly 100A is similar to the droplet catcher assembly 100 shown in FIGS. 4A and 4B. In the present embodiment, the droplet catcher assembly 100A may include a catcher body 110A, a first heat transfer part 120, a second heat transfer part 130, a temperature sensor 140, and an outer housing 150. The first heat transfer part 120, the second heat transfer part 130, the temperature sensor 140, and the outer housing 150 of the droplet catcher assembly 100A may be similar to that of the droplet catcher assembly 100 as illustrated and described with reference to FIGS. 4A and 4B. The catcher body 110A of the droplet catcher assembly 100A may include a tube portion 112 and a flange 114 and further include a casing 113. The tube portion 112 and the flange 114 of the catcher body 110A may be similar to that of the catcher body 110 as described above, and the casing 113 may surround the tube portion 112 of the catcher body 110A, and attach to the tube portion 112 of the catcher body 110A. The first heat transfer part 120 and the second heat transfer part 130 are directly attached to the casing 113. In some embodiments, the casing 113 is directly attached to the tube portion 112. In some instances, the tube portion 112 may be fixed to the casing 113 by locking, buckling and the like. In the present embodiment, the flange 114 may be connected to the tube portion 112 by engaging the flange 114 with the casing 113.

In the present embodiment, similar to the droplet catcher assembly 100, the first heat transfer part 120 and the second heat transfer part 130 may be directly attached to the outer surface of the casing 113, as shown in FIG. 5A. However, in other instances, the first heat transfer part 120, the second heat transfer part 130, or both, may be embedded in the casing 113. In some embodiments, the first heat transfer part 120, the second heat transfer part 130, or both, may wind along an outer surface of the casing 113. In some instances, the first heat transfer part 120 or the second heat transfer part 130 may be arranged along a spiral-shaped path. The first heat transfer part 120 and the second heat transfer part 130 may be integrated with the casing 113, or, the first heat transfer part 120, the second heat transfer part 130, or both, may be discrete elements detachably attached to the outer surface of the casing 113. The casing 113 for example, may be made of copper, stainless steel, or other appropriate material that is able to be heated to a preset operating temperature, for example, a temperature higher than 255° C. to 300° C., or higher than the melting point of the droplet material, and is able to transfer heat to the catcher body. The casing 113 and the catcher body 110 may be made of the same or of different material.

Figure 6A:
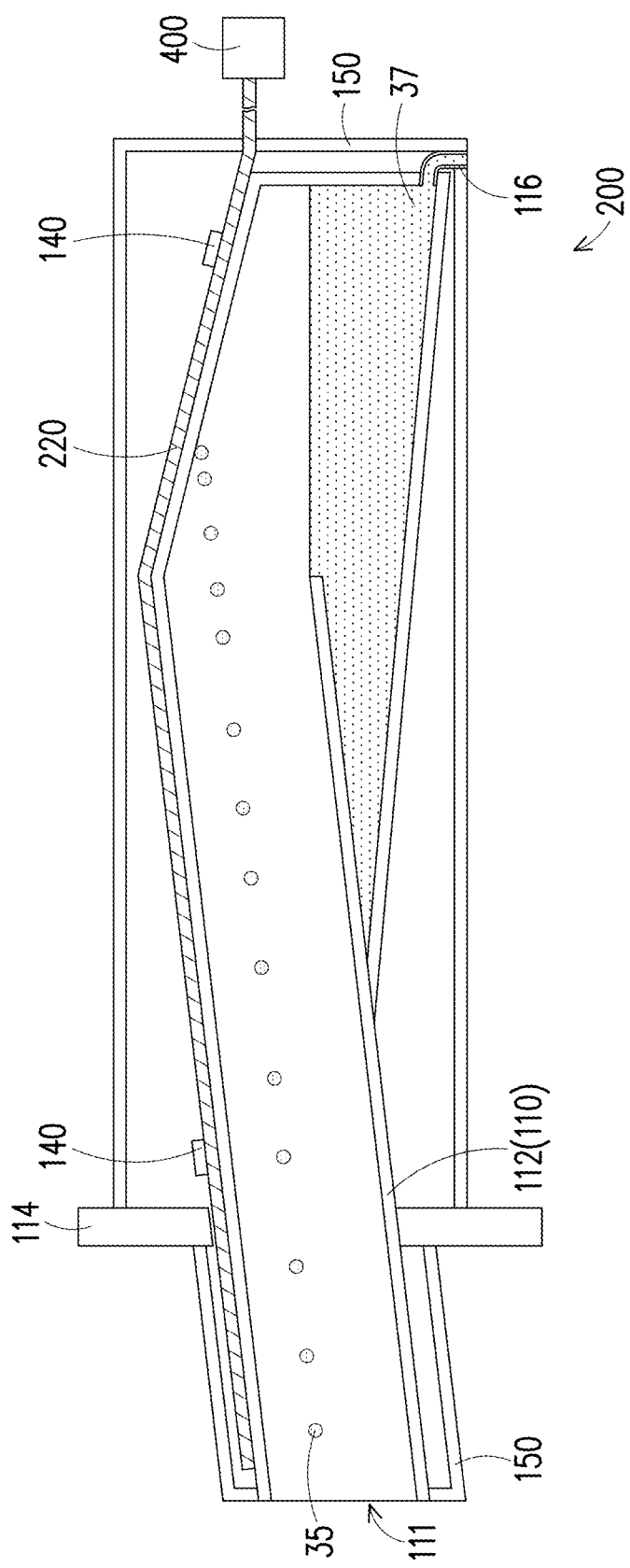
FIG. 6A is a cross-sectional view schematically illustrating a droplet catcher assembly of a droplet catcher system in accordance with some embodiments of the present disclosure.
Figure 6B:
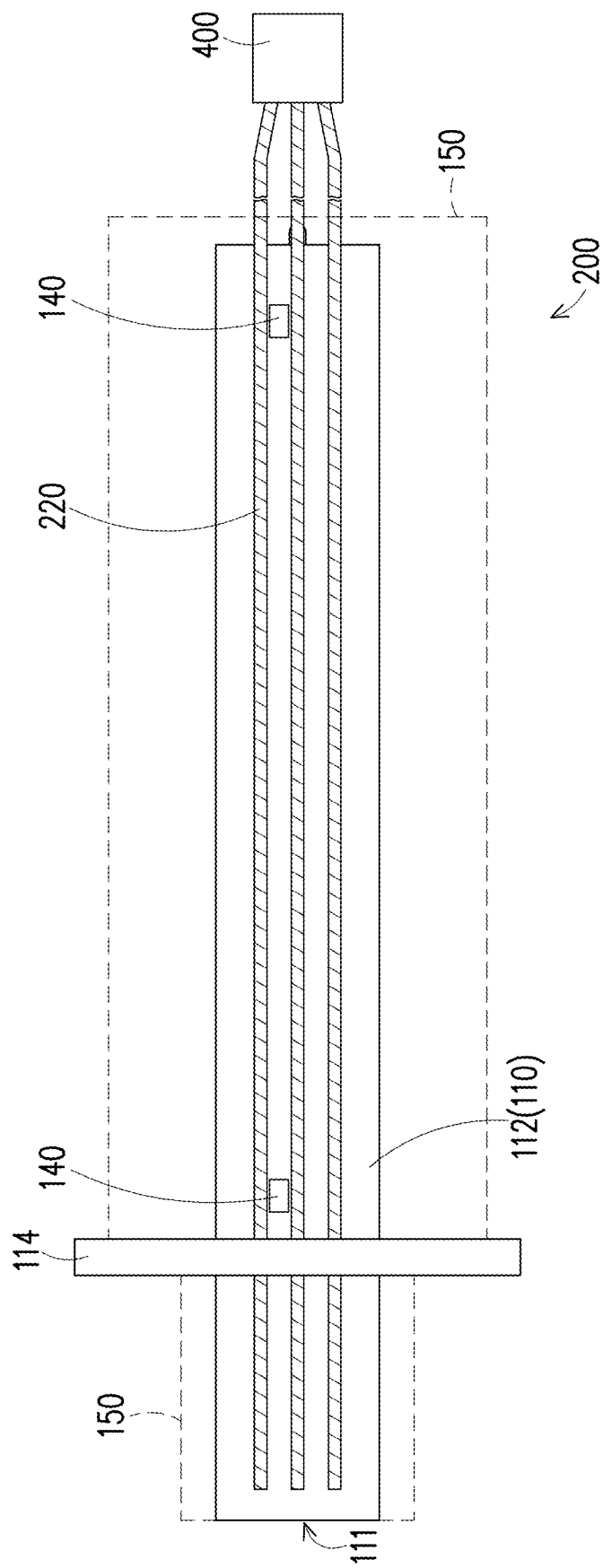
FIG. 6B is a perspective top view schematically illustrating the droplet catcher assembly shown in FIG. 6A in accordance with some embodiments of the present disclosure.

FIG. 6A is a cross-sectional view schematically illustrating a droplet catcher assembly of a droplet catcher system in accordance with some embodiments of the present disclosure, and FIG. 6B is a perspective top view schematically illustrating the droplet catcher assembly shown in FIG. 6A. Referring to FIGS. 6A and 6B, in the present embodiment, the droplet catcher assembly 200 may include a catcher body 110, a heat transfer part 220, a temperature sensor 140, and an outer housing 150. The catcher body 110, the temperature sensor 140, and the outer housing 150 of the droplet catcher assembly 200 may be similar to that of the droplet catcher assembly 100 as illustrated and described with reference to FIGS. 4A and 4B. As shown in FIG. 6A, the heat transfer part 220 may be directly attached to the outer surface of the catcher body 110. However, in other instances, the heat transfer part 220 may be embedded in the catcher body 110. In some embodiments, the heat transfer part 220 may include a heat pipe, such as Constant Conductance Heat Pipes (CCHPs) and other suitable kinds of heat pipe. In other embodiments, the heat transfer part 220 may be a pipe allowing heat transfer fluid to flow through, and namely, in some instances, the heat transfer part 220 may be a pipe filled with heat transfer fluid. The heat transfer fluid within the heat transfer part 220 may be, for example, liquid such as water, oil, liquid metal, or other thermal conducting liquid with or without conducting particle (e.g., high thermal conducting liquid with nano-particle metal). In some other instances, the heat transfer fluid may also be gas such as air, clean air, clean dry air (CDA), $N_2$, He, Ar, steam, or other thermal conducting gas.

In FIGS. 6A and 6B, the heat transfer part 220 may be line-shaped and directly attached to the outer surface of the catcher body 110. However, in other embodiments, the heat transfer part 220 may be spiral-shaped or may wind along an outer surface of the catcher body 110. Other suitable shapes of the heat transfer part, such as U-shaped, are within the contemplated scope of the present disclosure. In the embodiment shown in FIGS. 6A and 6B, one end of the heat transfer part 220 may extend toward the open end 111 of the catcher body 110, and the other end of the heat transfer part 220 may be thermally coupled to the heat exchanger 400, such that heat may be input from heat exchanger 400 to the droplet catcher assembly 200, or output from droplet catcher assembly 200 to the heat exchanger 400 through the heat transfer part 220.

Figure 7:
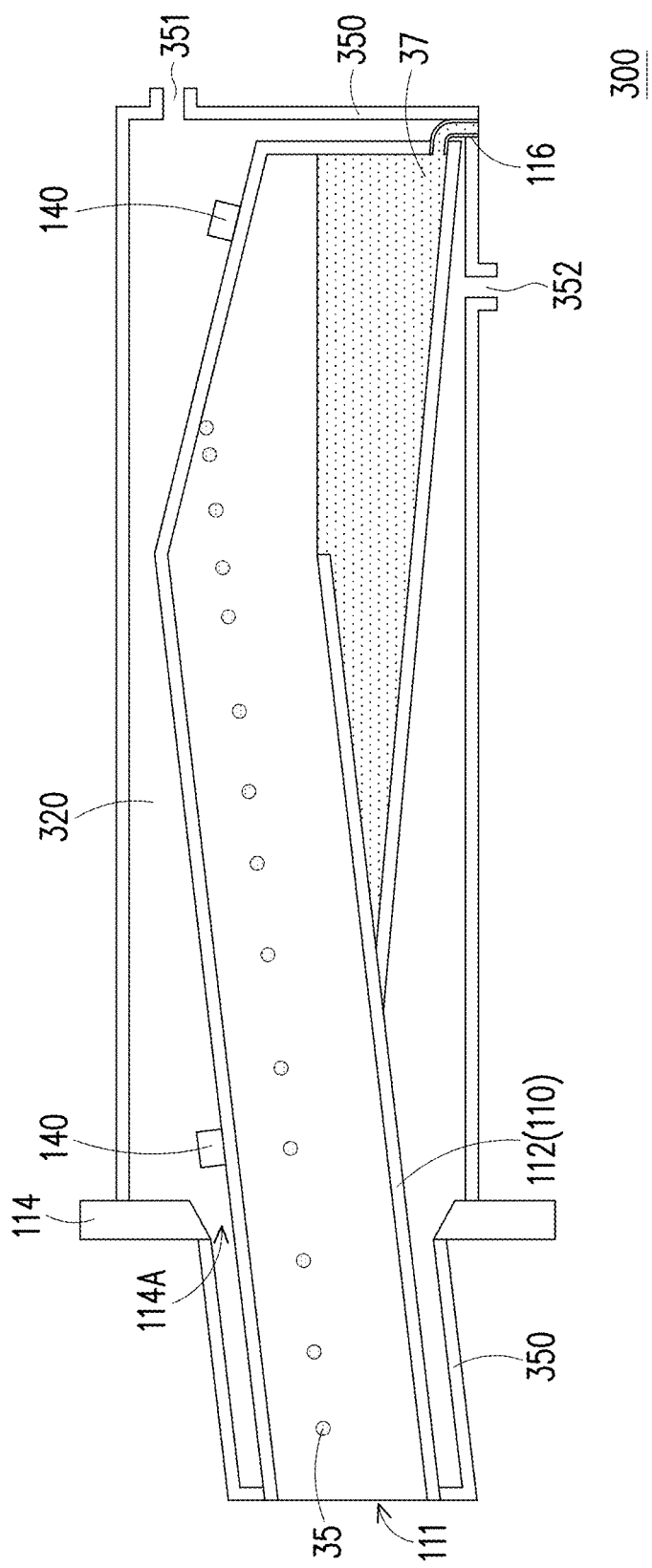
FIG. 7 is a cross-sectional view schematically illustrating a droplet catcher assembly of a droplet catcher system in accordance with some embodiments of the present disclosure.

FIG. 7 is a cross-sectional view schematically illustrating a droplet catcher assembly of a droplet catcher system in accordance with some embodiments of the present disclosure. Referring to FIG. 7, the droplet catcher assembly 300 includes a catcher body 110 and an outer housing 350, in which a heat transfer part 320 may be formed with the space between the catcher body 110 and the outer housing 350. The catcher body 110 of the droplet catcher assembly 300 may be similar to that of the droplet catcher assembly 100 as illustrated and described with reference to FIGS. 4A and 4B. As the catcher body 110 shown in FIGS. 4A and 4B, the catcher body 110 shown in FIG. 7 may include a tube portion 112 and a flange 114. In some instances, the outer housing 350 may include an inlet 351 and an outlet 352 of the heat transfer fluid, allowing the heat transfer fluid to flow through the heat transfer part 320.

In some embodiments, as shown in FIG. 7, the flange 114 of the catcher body 110 may include at least one through hole 114A, such that the heat transfer fluid may flow through the flange 114 to a portion of the space between the catcher body 110 and the outer housing 350 that near the open end 111 of the tube portion 112, and therefore a portion of the tube portion 112 adjacent to the open end 111 may be heated or cooled by the heat transfer fluid flowing through the heat transfer part 320. In some cases, the flange 114 may not directly connect to the tube portion 112, but connect to the outer housing 350 to be fixed with respect to the tube portion 112.

Figure 8:
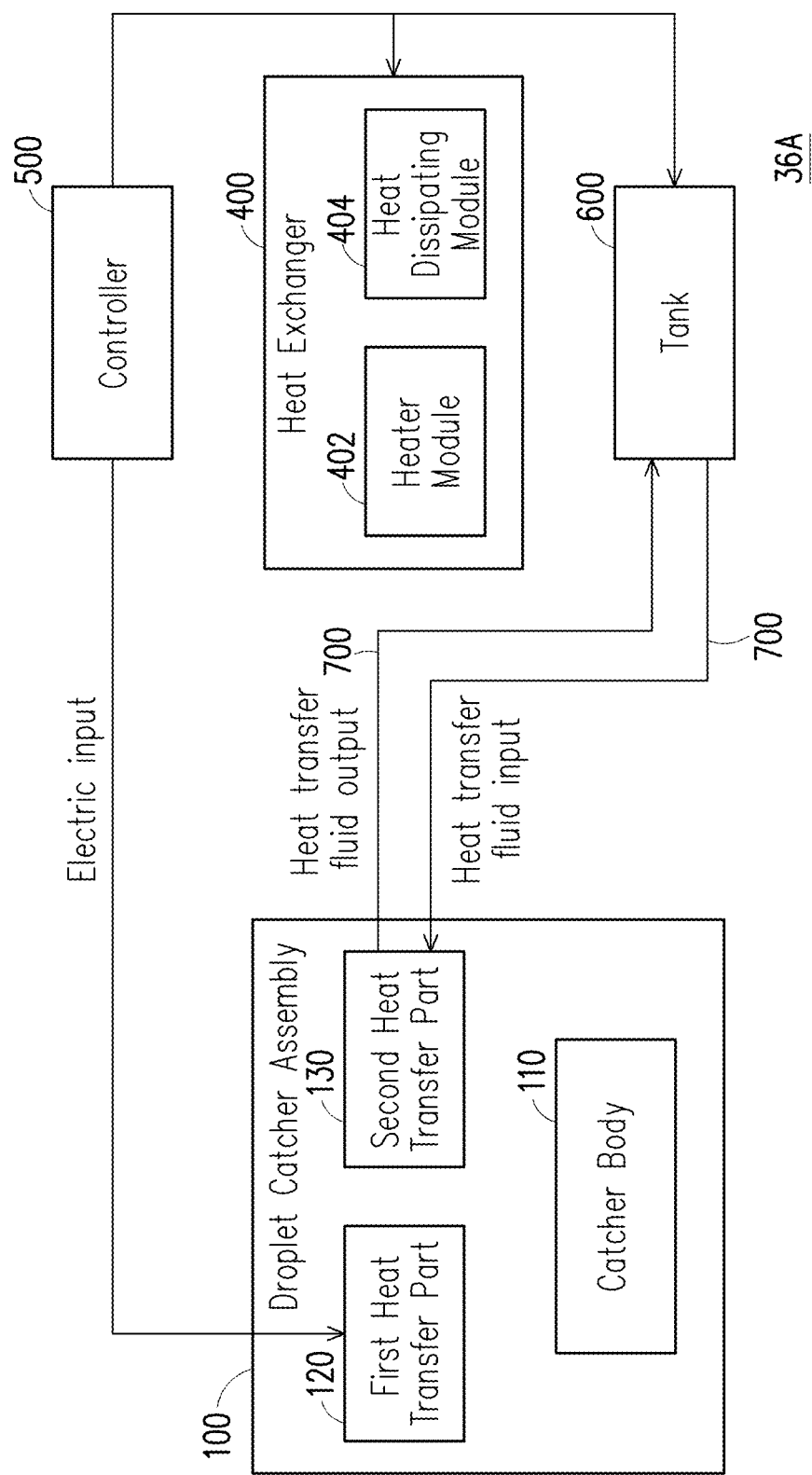
FIGS. 8-10 are schematic views of droplet catcher systems in accordance with some embodiments of the present disclosure.
Figure 9:
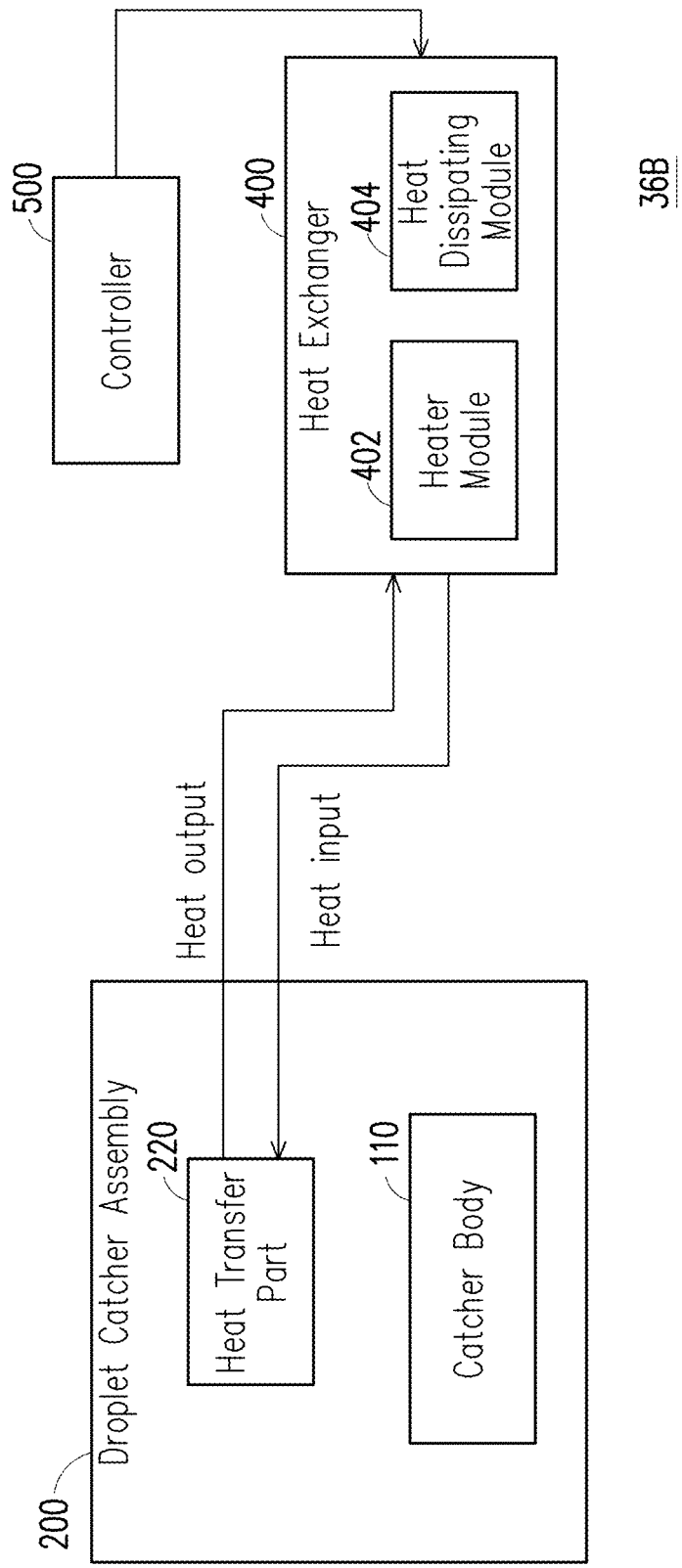
Figure 10:
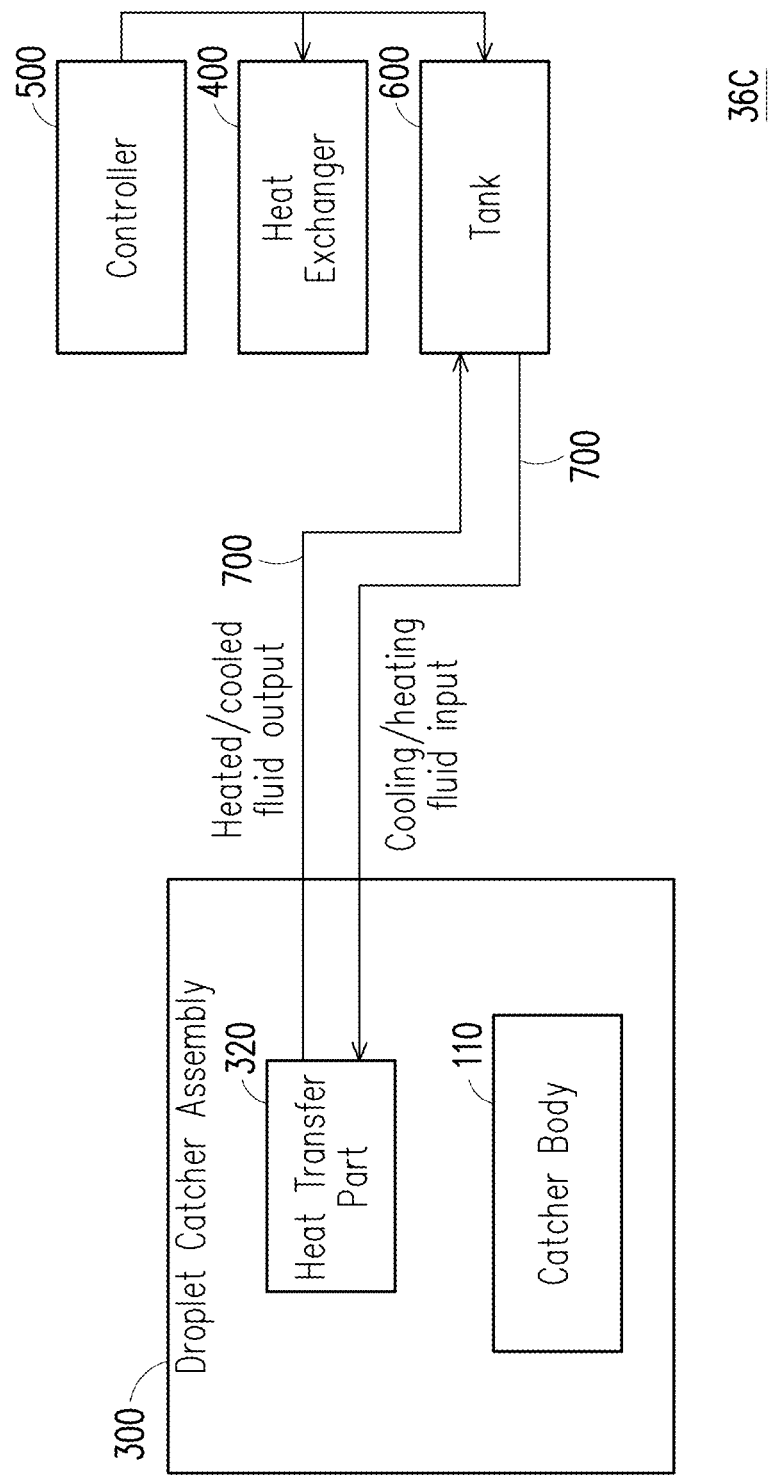

FIGS. 8-10 are schematic views of droplet catcher systems in accordance with some embodiments of the present disclosure.

Referring to FIG. 8, the droplet catcher system 36A includes a catcher body 110, a first heat transfer part 120, a second heat transfer part 130, a heat exchanger 400, and a controller 500. The droplet catcher system 36A may be included in an EUV lithography apparatus, for example, the EUV lithography apparatus 10, as an exemplary implemental example of the droplet catcher 36 for the radiation source 12 shown in FIG. 2. The catcher body 110, the first heat transfer part 120 and the second heat transfer part 130 may construct a droplet catcher assembly, such as the droplet catcher assembly 100 of FIGS. 4A and 4B as discussed above. Therefore, detailed descriptions for the droplet catcher assembly 100 are not described herein again.

The heat exchanger 400 may include a heat dissipating module 404. In some embodiments, the heat dissipating module 404 may include a thermal exchanger with a compressor or a refrigerant based system (e.g., air conditioner, refrigerating machine, refrigerator, and refrigeration system), or a thermoelectric cooling system. In some embodiments, the heat dissipating module 404 may include a radiator, such as radiation fin or other suitable radiator, or a radiator fan. In some embodiments, the heat dissipating module 404 may include multiple radiator fans, or a combination of radiation fins and radiator fans. In some embodiments, the heat exchanger 400 may also include a heater module 402. The heater module 402 may include a heater, for example ceramic heater or air heater. In some instances, the compressor or refrigerant based system, or the thermoelectric cooling system stated above may also be used as a heater module 402.

In some embodiments, the heat exchanger 400 may be thermally coupled to the second heat transfer part 130. In the embodiment shown in FIG. 8, the droplet catcher system 36A may also include a tank 600 and conduits 700. The tank 600 may be a liquid tank or a gas tank, or any other container suitable for containing heat transfer fluid. The conduits 700 may be connected between the second heat transfer part 130, e.g., a pipe, and the tank 600, such that the tank 600 is in fluid communication with the second heat transfer part 130. As shown in FIG. 8, the conduits 700 may connect to both ends of the second heat transfer part 130 to form a loop, and namely, the heat transfer fluid may be input from the tank 600 to the second heat transfer part 130, and the heat transfer fluid may be output from second heat transfer part 130 to the tank 600 through the conduits 700.

In the present embodiment, the heat exchanger 400 is thermally coupled to the second heat transfer part 130, such that heat of the catcher body 110 may be transferred to the heat exchanger 400, and alternatively, heat generated from the heat exchanger 400 may be transferred to the catcher body 110 of the droplet catcher assembly 100. In some instances, the heat exchanger 400 is thermally coupled to the conduits 700, or, in some instances, the heat exchanger 400 is thermally coupled to the tank 600. Therefore, the heat of the catcher body 110 may be taken away by the heat transfer fluid flowing through the second heat transfer part 130, and the heat transfer fluid heated by the catcher body 110 may then flow through the conduits 700 to enter the tank 600. The heat transfer fluid heated by the catcher body 110 may be cooled in the conduits 700 and/or in the tank 600 by the heat exchanger 400. Thereafter, the cooled heat transfer fluid may further input to the second heat transfer part 130 while the temperature of the heat transfer fluid is lower than the temperature of the catcher body 110. Under some instances, the heat exchanger 400 may heat the heat transfer fluid in the conduits 700 and/or the tank 600, and then the heated heat transfer fluid may be input to the second heat transfer part 130 to heat the catcher body 110 by flowing through the second heat transfer part 130.

In some embodiments, the droplet catcher system 36A may further include a pump, and the pump is operably connected to the second heat transfer part 130, such that the pump may drive the heat transfer fluid to flow between the second heat transfer part 130 and the tank 600, or in other words, drive the heat transfer fluid to cycle in the loop formed by the second heat transfer part 130, the tank 600, and the conduits 700.

In the present embodiment, the controller 500 may be electrically coupled to the first heat transfer part 120 and the heat exchanger 400. The controller 500 may include a processor system, such as a processor configured to execute instructions stored on and/or provided by a memory coupled to the processor. In some embodiments, the controller 500 may be configured to control the operation of the first heat transfer part 120, e.g. an electrical heater. The controller may provide electric power for the first heat transfer part 120, in accordance with some embodiments. In some embodiments, the controller 500 may be configured to control the operation of the heat exchanger 400 and switch between the heater module 402 and the heat dissipating module 404 of the heat exchanger 400. The controller 500 may also independently drive the heater module 402 or the heat dissipating module 404 of the heat exchanger 400, in accordance with some embodiments. In some cases, the controller 500 may be electrically coupled to the pump to drive and control the flowing of the heat transfer fluid. In some instances, the controller 500 may be integrated into, or may share one or more processors, memory boards, etc. with the controller of the EUV lithography apparatus 10. For example, the controller may coordinate the pulses of the laser source and the droplet generating rate of the droplet generator.

The embodiment shown in FIG. 8 includes the droplet catcher assembly 100. However, the droplet catcher assemblies in different configurations, for example, the droplet catcher assembly 100A as shown in FIGS. 5A and 5B, or the droplet catcher assembly 300 as shown in FIG. 7 may also be operable with the heat exchanger 400, controller 500, and the tank 600 of the droplet catcher system 36A in substantially the same manner discussed above.

Referring to FIG. 9, the droplet catcher system 36B shown in FIG. 9 includes a catcher body 110, a heat transfer part 220, a heat exchanger 400, and a controller 500. The droplet catcher system 36B may be included in an EUV lithography apparatus, for example, the EUV lithography apparatus 10, as a droplet catcher for the radiation source 12 shown in FIG. 2. The catcher body 110 and the heat transfer part 220 may be included in a droplet catcher assembly, such as the droplet catcher assembly 200 of FIGS. 6A and 6B as discussed above. Therefore, detailed descriptions thereof are not described herein again.

The heat exchanger 400 and the controller 500 are similar to that of in the droplet catcher system 36A. In the present embodiments, the heat exchanger 400 may be thermally coupled to the heat transfer part 220, e.g., a heat pipe, particularly, the heater module 402 and the heat dissipating module 404 of the heat exchanger 400 may be thermal coupled to the heat transfer part 220, such that the heat of the catcher body 110 may be output to the heat exchanger 400, and the heat generated from the heat exchanger 400 may be input into the catcher body 110 through the heat transfer part 220. In the present embodiments, the controller 500 is electrically coupled to the heat exchanger 400 and may be adapted to independently drive the heater module 402 and the heat dissipating module 404 of the heat exchanger 400. In some instances, the controller 500 may control the operation of the heat exchanger 400 and may control the heat exchanger 400 to switch between the heater module 402 and the heat dissipating module 404.

Referring to FIG. 10, the droplet catcher system 36C shown in FIG. 10 includes a catcher body 110, a heat transfer part 320, a heat exchanger 400, a controller 500, a tank 600, and conduits 700. The droplet catcher system 36C may be included in an EUV lithography apparatus, for example, the EUV lithography apparatus 10, as a droplet catcher for the radiation source 12 shown in FIG. 2. The catcher body 110 and the heat transfer part 320 may be included in a droplet catcher assembly, such as the droplet catcher assembly 300 of FIG. 7 as discussed above. Therefore, detailed descriptions thereof are not described herein again.

The heat exchanger 400, the controller 500, the tank 600, and the conduits 700 are similar to that of in the droplet catcher system 36A. In the present embodiments, the tank 600 may be a gas tank, and the heat exchanger 400 may include a heater, e.g., an air heater. In the present embodiment, the heat transfer part 320 may allow the heat transfer fluid to flow through. In some embodiments, the heat transfer fluid may flow through the heat transfer part 320 by inputting the heat transfer fluid from the tank 600 into the inlet 351 of the heat transfer part 320, and outputting the heat transfer fluid from the outlet 352 of the heat transfer part 320 to the tank 600.

In some instances, the heat transfer fluid in the tank 600 may be heated by the heat exchanger 400, e.g., a heater or an air heater prior to entering the heat transfer part 320, and the catcher body 110 may be heated by allowing the heated heat transfer fluid to flow through the heat transfer part 320, and in other words, inputting heating gas into the heat transfer part 320. In some instances, the heat transfer fluid may flow through the heat transfer part 320 with the heater turned off, and therefore, the heat transfer fluid may be cooler than the catcher body 110 and serve as the cooling gas. The heat transfer fluid, alternatively the cooling gas, flowing through the heat transfer part 320 may be heated by the catcher body 110, such that the temperature of the catcher body 110 may be reduced. In the present embodiment, the controller 500 may be configured to switch the droplet catcher system 36C between a heating mode of inputting heating gas to the heat transfer part 320 and a cooling mode of inputting cooling gas to the heat transfer part 320.

Figure 11:
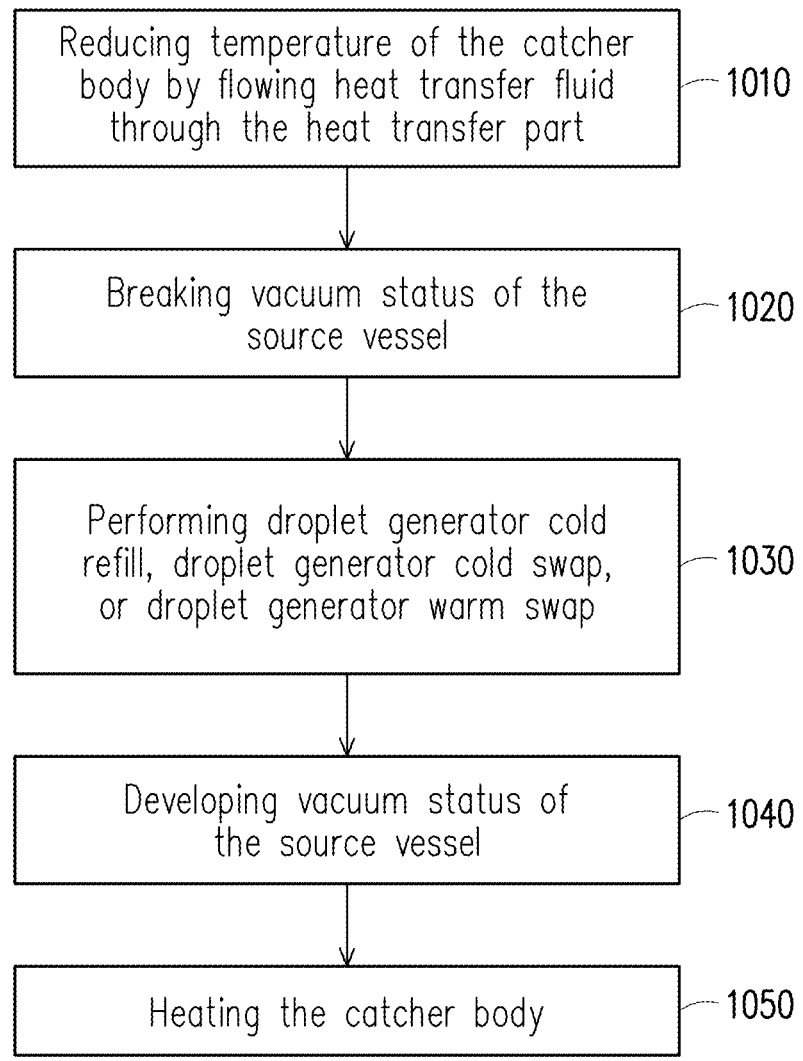
FIG. 11 is a flowchart of a maintenance method of an EUV lithography apparatus in accordance with some embodiments of the present disclosure.

FIG. 11 is a flowchart of a maintenance method 1000 of an EUV lithography apparatus in accordance with some embodiments of the present disclosure. The maintenance method in accordance with some embodiments may be operable on an EUV lithography apparatus, e.g., the EUV lithography apparatus 10 shown in FIG. 1, that includes a source vessel, a droplet generator and a droplet catcher assembly. In the present embodiment, the droplet catcher assembly includes a catcher body and a heat transfer part attached thereto, and the droplet generator and the catcher body are connected to the source vessel and aligned with each other. In some embodiments, the droplet catcher may include any or all of the features, properties, and parameters discussed above with respect to the droplet catcher system 36A, the droplet catcher system 36B, and the droplet catcher system 36C of FIGS. 8-10. As discussed above, various droplet catcher assemblies, such as the droplet catcher assembly 100, the droplet catcher assembly 100A, the droplet catcher assembly 200, and the droplet catcher assembly 300 as shown in FIGS. 4A-4B, 5A-5B, 6A-6B, and 7 may be included in the droplet catcher systems when applicable. The maintenance method 1000 of FIG. 11 may be performed under a PM process of an EUV lithography apparatus, e.g., the PM process shown in FIG. 3. In some cases, a method similar to the maintenance method 1000, for example, including step 1010, step 1020, step 1040, and step 1050, may also be performed under an unexpected inspection process or repair process of the EUV lithography apparatus when a safety issue is detected by a safety instrumented system.

Referring to FIG. 11, at step 1010, a maintenance method 1000 of an EUV lithography apparatus includes reducing a temperature of the catcher body by flowing a heat transfer fluid through the heat transfer part, in accordance with an embodiment of the present disclosure. In some embodiments, the temperature of the catcher body may be decreased from the operation temperature of the EUV lithography apparatus, for example, a temperature higher than 250° C., or higher than 255° C. to 300° C., or higher than the melting point of the droplet material, to 120° C., or 100° C., or lower, or room temperature. In some embodiments, the heat transfer part may include any or all of the features and properties discussed above with respect to the second heat transfer part 130 of FIGS. 4A-4B and 5A-5B and the heat transfer part 320 of FIG. 7. The catcher body may be catcher body 110 or catcher body 110A with tube portion 112 as described above. However, other structures and configurations of catcher body suitable for receiving the droplets are contemplated and are within the scope of the present disclosure. In some embodiments, the heat transfer fluid may be, for example, liquid such as water, oil, liquid metal, or other thermal conducting liquid with or without conducting particle (e.g., high thermal conducting liquid with nano-particle metal). In some embodiments, the heat transfer fluid may be gas such as air, clean air, clean dry air (CDA), $N_2$, He, Ar, steam, or other thermal conducting gas. In the embodiments including heating the heat transfer fluid through a heater before the heat transfer fluid flows into the heat transfer part, the step 1010 may include flowing the heat transfer fluid through the heat transfer part with the heater turned off. The heater may be any applicable configuration discussed above. In some embodiments, flowing the heat transfer fluid through the heat transfer part may include inputting the heat transfer fluid from a tank into an inlet of the heat transfer part, and outputting the heat transfer fluid from an outlet of the heat transfer part to the tank. For example, in an embodiment including the droplet catcher system 36A as shown in FIG. 8, the heat transfer fluid with temperature lower than that of the catcher body 110 may flow through the second heat transfer part 130, and the heat transfer fluid flowed through the second heat transfer part 130 and heated by the catcher body 110 may then be cooled in the conduits 700 and/or in the tank 600 by the heat exchanger 400. Alternatively, in an embodiment including the droplet catcher system 36C as shown in FIG. 10, the heat transfer fluid with temperature lower than that of the catcher body 110 may flow through the heat transfer part 320, and the heat transfer fluid flowed through the heat transfer part 320 and heated by the catcher body 110 may then be cooled in the conduits 700 and/or in the tank 600 by the heat exchanger 400. With step 1010, the maintenance operation time may be reduced. For example, the operation time of a preparing stage similar to that of in FIG. 3 may be reduced from several hours to tens of minutes or several minutes. In some instances, the droplet catcher system may drain out droplet material captured in the droplet catcher during step 1010 to further shorter the maintenance time.

At step 1020, the maintenance method 1000 of an EUV lithography apparatus includes breaking a vacuum status of the source vessel, for example, the source vessel 30 as shown in FIG. 2, after the temperature of the catcher body is reduced to a predetermined point, in accordance with an embodiment of the present disclosure. In some embodiments, the predetermined point of temperature of the catcher body may be 120° C., or 100° C. or lower, or room temperature as stated above, for the safety of the maintenance operation.

At step 1030, the maintenance method 1000 of an EUV lithography apparatus includes performing at least one of the following operations after the temperature of the catcher body is reduced to the predetermined point: a droplet generator cold refill, a droplet generator cold swap, and a droplet generator warm swap, in accordance with an embodiment of the present disclosure. For example, the droplet generator 34 shown in FIG. 2 may be replaced by a new one, or the droplet material in the droplet generator 34 may be supplemented, under certain temperature conditions. Other operations of PM, such as cleaning or purging the source vessel, or inspection of the EUV lithography apparatus may also be performed when applicable.

At step 1040, the maintenance method 1000 of an EUV lithography apparatus includes developing the vacuum status of the source vessel, for example, the source vessel 30 as shown in FIG. 2, before heating the catcher body, in accordance with an embodiment of the present disclosure, such that the probability of the droplet material oxidation and the absorption of the EUV radiation may be reduced. In some embodiments, the source vessel 30 may be re-built into an air-tight enclosed chamber and then the gas pressure inside the source vessel 30 may be reduced to a vacuum status. In some embodiments, as shown in FIG. 3, a leak test for the source vessel may be performed, for example, after the source vessel 30 is re-built into an air-tight enclosed chamber.

At step 1050, the maintenance method 1000 of an EUV lithography apparatus includes heating the catcher body by allowing the heat transfer fluid to flow through the heat transfer part, in accordance with an embodiment of the present disclosure. In some embodiments, the temperature of the catcher body may be heated to the operation temperature of the EUV lithography apparatus, for example, a temperature higher than 250° C., or higher than 255° C. to 300° C., or higher than the melting point of the droplet material as stated above. As stated in step 1010, the heat transfer part may include any or all of the features and properties discussed above with respect to the second heat transfer part 130 of FIGS. 4A-4B and 5A-5B and the heat transfer part 320 of FIG. 7. The catcher body may be catcher body 110 or catcher body 110A with tube portion 112 as described above. However, other structures and configurations of catcher body suitable for receiving the droplets are contemplated and are within the scope of the present disclosure. In some embodiments, the heat transfer fluid may be, for example, liquid such as water, oil, liquid metal, or other thermal conducting liquid with or without conducting particle (e.g., high thermal conducting liquid with nano-particle metal). In some embodiments, the heat transfer fluid may be gas such as air, clean air, clean dry air (CDA), $N_2$, He, Ar, steam, or other thermal conducting gas. In some embodiments, step 1050 may include heating the heat transfer fluid through a heater before the heat transfer fluid flows into the heat transfer part. The heater may be any applicable configuration discussed above. In some embodiments, flowing the heat transfer fluid through the heat transfer part may include inputting the heat transfer fluid from a tank into an inlet of the heat transfer part, and outputting the heat transfer fluid from an outlet of the heat transfer part to the tank. For example, in an embodiment including the droplet catcher system 36A as shown in FIG. 8, the heat transfer fluid may be heated to a temperature higher than that of the catcher body 110 by a heater module 402 of the heat exchanger 400, and the heated heat transfer fluid may then flow through the second heat transfer part 130 to heat the catcher body 110. Alternatively, in an embodiment including the droplet catcher system 36C as shown in FIG. 10, the heat transfer fluid may be heated to a temperature higher than that of the catcher body 110 by the heater module 402 of the heat exchanger 400, and the heated heat transfer fluid may then flow through the heat transfer part 320 to heat the catcher body 110.

In an alternative embodiment, for example, when the droplet catcher system is undergoing a warm swap maintenance, a maintenance method similar to the maintenance method 1000 may be performed by executing step 1010, step 1030 and step 1050. In other words, step 1020 and step 1040 may be omitted.

In accordance with some embodiments of the disclosure, a droplet catcher system of an EUV lithography apparatus is provided. The droplet catcher system includes a catcher body, a first heat transfer part, a second heat transfer part, a heat exchanger, and a controller. The first heat transfer part is directly attached to the catcher body. The second heat transfer part is directly attached to the catcher body. The heat exchanger is thermally coupled to the second heat transfer part. The controller is electrically coupled to the heat exchanger and the first heat transfer part.

In accordance with some embodiments of the disclosure, a droplet catcher system of an EUV lithography apparatus is provided. The droplet catcher system includes a catcher body, a heat transfer part, a heat exchanger, and a controller. The catcher body has an outer surface. The heat transfer part is directly attached to the outer surface of the catcher body. The heat exchanger is thermally coupled to the heat transfer part. The controller is electrically coupled to the heat exchanger.

In accordance with some embodiments of the disclosure, a maintenance method of an EUV lithography apparatus is provided. The EUV lithography apparatus includes a source vessel, a droplet generator and a droplet catcher assembly. The droplet catcher assembly comprises a catcher body and a heat transfer part attached to the catcher body. The droplet generator and the catcher body are connected to the source vessel and aligned with each other. The maintenance method includes reducing a temperature of the catcher body by flowing a heat transfer fluid through the heat transfer part, and breaking a vacuum status of the source vessel after the temperature of the catcher body is reduced to a predetermined point.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A droplet catcher system of an EUV lithography apparatus, comprising:
a catcher body, comprising a tube portion and a flange connected to the tube portion, wherein the flange divides the tube portion into a first section and a second section, the first section extends between the flange and an open end of the tube portion, and the second section extends from the flange away from the open end;
a first heat transfer part, directly attached to the catcher body and arranged along the first section and the second section;
a second heat transfer part, directly attached to the catcher body;
a heat exchanger, thermally coupled to the second heat transfer part; and
a controller, electrically coupled to the heat exchanger and the first heat transfer part.

2. The droplet catcher system of the EUV lithography apparatus as claimed in claim 1, wherein the first heat transfer part comprises an electrical heater.

3. The droplet catcher system of the EUV lithography apparatus as claimed in claim 1, wherein the catcher body comprises a casing, wherein the first heat transfer part and the second heat transfer part are directly attached to the casing.

4. The droplet catcher system of the EUV lithography apparatus as claimed in claim 1, wherein the second heat transfer part comprises a pipe filled with a heat transfer fluid.

5. The droplet catcher system of the EUV lithography apparatus as claimed in claim 4, further comprising a tank and conduits, wherein the tank is in fluid communication with the pipe through the conduits.

6. The droplet catcher system of the EUV lithography apparatus as claimed in claim 5, wherein the heat exchanger is thermally coupled to at least one of the conduits and the tank.

7. The droplet catcher system of the EUV lithography apparatus as claimed in claim 1, wherein at least one of the first heat transfer part and the second heat transfer part is embedded in the catcher body.

8. The droplet catcher system of the EUV lithography apparatus as claimed in claim 1, wherein the second heat transfer part is arranged along the first section and the second section of the tube portion.

9. The droplet catcher system of the EUV lithography apparatus as claimed in claim 1, further comprising a temperature sensor dispositioned on the catcher body.

10. The droplet catcher system of the EUV lithography apparatus as claimed in claim 1, wherein at least one of the first heat transfer part and the second heat transfer part winds along a circumference of the tube portion of the catcher body.

11. A droplet catcher system of an EUV lithography apparatus, comprising:
a catcher body having an outer surface and comprising a tube portion and a flange connected to the tube portion, wherein the flange divides the tube portion into a first section and a second section, the first section extends between the flange and an open end of the tube portion, and the second section extends from the flange away from the open end;
a heat transfer part, directly attached to the outer surface of the catcher body and arranged along the first section and the second section;
a heat exchanger, thermally coupled to the heat transfer part; and
a controller, electrically coupled to the heat exchanger.

12. The droplet catcher system of the EUV lithography apparatus as claimed in claim 11, wherein the heat exchanger further comprises a heater module and a heat dissipating module, the heater module and the heat dissipating module are in thermal coupled to the heat transfer part, and the controller is adapted to independently drive the heater module and the heat dissipating module.

13. The droplet catcher system of the EUV lithography apparatus as claimed in claim 11, wherein the heat transfer part comprises a heat pipe.

14. The droplet catcher system of the EUV lithography apparatus as claimed in claim 11, wherein the heat transfer part comprises a pipe filled with a heat transfer fluid.

15. A maintenance method of the EUV lithography apparatus, wherein the EUV lithography apparatus comprises a source vessel, a droplet generator and a droplet catcher assembly, the droplet catcher assembly comprises a catcher body comprising a tube portion and a flange connected to the tube portion and a heat transfer part attached to the catcher body, and the droplet generator and the catcher body are connected to the source vessel and aligned with each other, wherein the flange divides the tube portion into a first section between the flange and an open end of the tube portion and a second section extending from the flange away from the open end, the first section is inserted into the source vessel, and the heat transfer part is arranged along the first section and the second section, the maintenance method comprising:
reducing a temperature of the first section and the second section of the catcher body by flowing a heat transfer fluid through the heat transfer part; and
breaking a vacuum status of the source vessel after the temperature of the first section and the second section of the catcher body is reduced to a predetermined point.

16. The maintenance method of the EUV lithography apparatus as claimed in claim 15, further comprising:
developing the vacuum status of the source vessel; and
heating the catcher body by allowing the heat transfer fluid to flow through the heat transfer part.

17. The maintenance method of the EUV lithography apparatus as claimed in claim 16, wherein the heating the catcher body comprises heating the heat transfer fluid through a heater before the heat transfer fluid flows into the heat transfer part.

18. The maintenance method of the EUV lithography apparatus as claimed in claim 17, wherein the reducing the temperature of the catcher body comprises flowing the heat transfer fluid through the heat transfer part with the heater turned off.

19. The maintenance method of the EUV lithography apparatus as claimed in claim 15, wherein the flowing the heat transfer fluid through the heat transfer part comprises inputting the heat transfer fluid from a tank into an inlet of the heat transfer part, and outputting the heat transfer fluid from an outlet of the heat transfer part to the tank.

20. The maintenance method of the EUV lithography apparatus as claimed in claim 15, further performing at least one of following operations after the temperature of the catcher body is reduced to the predetermined point: a droplet generator cold refill, a droplet generator cold swap, a droplet generator warm swap.

* * * * *